United States Patent
Patel et al.

(10) Patent No.: US 7,869,714 B2
(45) Date of Patent: Jan. 11, 2011

(54) ELECTRONIC SYSTEM HAVING FREE SPACE OPTICAL ELEMENTS

(75) Inventors: Chandrakant Patel, Fremont, CA (US); Shih-Yuan Wang, Palo Alto, CA (US); Philip J. Kuekes, Menlo Park, CA (US); R. Stanley Williams, Redwood City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 686 days.

(21) Appl. No.: 11/835,833

(22) Filed: Aug. 8, 2007

(65) Prior Publication Data

US 2009/0041466 A1    Feb. 12, 2009

(51) Int. Cl.
*H04B 10/00* (2006.01)
(52) U.S. Cl. .............. 398/118; 398/128; 398/130; 398/135; 398/136; 398/119; 385/89; 385/90; 385/92; 385/93; 361/677; 361/752; 361/695
(58) Field of Classification Search ........... 398/164, 398/128, 130, 135, 136, 137, 138, 139, 118, 398/119, 124, 129, 131; 385/14, 88, 89, 385/90, 92, 93; 361/700, 699, 752, 695, 361/677
See application file for complete search history.

(56) References Cited

U.S. PATENT DOCUMENTS

| 5,224,184 A | 6/1993 | Boudreau | |
|---|---|---|---|
| 6,014,238 A * | 1/2000 | McDunn et al. | 398/116 |
| 6,101,201 A | 8/2000 | Hargis et al. | |
| 6,263,007 B1 | 7/2001 | Tang | |
| 6,650,844 B1 * | 11/2003 | Davies et al. | 398/164 |
| 6,661,943 B2 | 12/2003 | Li | |
| 6,775,480 B1 | 8/2004 | Goodwill | |
| 6,799,902 B2 | 10/2004 | Anderson et al. | |
| 7,150,543 B2 | 12/2006 | Fujimori et al. | |
| 2004/0208602 A1 * | 10/2004 | Plante | 398/140 |
| 2005/0174735 A1 * | 8/2005 | Mankaruse et al. | 361/695 |

FOREIGN PATENT DOCUMENTS

| KR | 1020010015992 A | 3/2001 |
|---|---|---|
| WO | 2002060074 A1 | 8/2002 |

* cited by examiner

*Primary Examiner*—Hanh Phan

(57) ABSTRACT

An electronic system includes a first circuit board having a first optical element and a second circuit board having a second optical element positioned to electronically communicate with the first optical element over free space. The system also includes a cold plate having openings positioned to enable the optical communications over free space is positioned between the first circuit board and the second circuit board. The system further includes a condenser and a fluid conduit containing a cooling fluid configured to absorb heat through the cold plate and to convey the heat to the condenser, where the fluid conduit connects the cold plate and the condenser.

20 Claims, 5 Drawing Sheets

ELECTRONIC SYSTEM HAVING FREE SPACE OPTICAL ELEMENTS

BACKGROUND

Free space optical interconnect systems have been proposed to meet ever increasing demands for additional bandwidth for data communication between electrical data processing units. These types of optical interconnect systems utilize point-to-point communications through free-space and therefore do not require the routing of cables or fibers between different locations. In a typical free space optical interconnect system, a modulated beam of light is directed through free space from a transmitter on a first optical device chip to a receiver on a second optical device chip. Data or information is encoded into the beam of light by means of the modulation. The receiver demodulates the modulated beam of light and extracts the corresponding data and information.

Free space optical interconnect systems have long been known to deliver fast, highly parallel data transfer and therefore have the potential to enable throughputs at rates much greater than are available with electrical interconnects. In addition, optically modulated signals are not affected by electromagnetic interference and can interpenetrate each other spatially without interfering with each other.

One drawback to the use of free space optical interconnect systems is that mechanically coupling the optical interconnect systems over free space so that they maintain precise alignment with one another has proven to be relatively difficult. This is because vibrations and temperature fluctuations frequently cause the optical interconnect systems to become misaligned in most systems. The use of additional structural support to substantially prevent relative movement between the optical interconnect systems is typically not a viable solution because the additional mechanical elements tend to substantially restrict airflow to the optical interconnect systems to adequately cool the optoelectronic chips. Without adequate cooling, their performance typically deteriorates. However, increased airflow over the optical interconnect systems also causes vibrations and variations in air density between the optical interconnect systems, which also deteriorate their performance.

It would therefore be beneficial to have the ability to maintain the components of free space optical interconnect systems in substantially precise alignment while maintaining them at or near desired operating temperature levels.

BRIEF DESCRIPTION OF THE DRAWINGS

Features of the present invention will become apparent to those skilled in the art from the following description with reference to the figures, in which.

DETAILED DESCRIPTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Disclosed herein is an electronic system composed of one or more free space modules. A free space module includes a system module having free space optical elements and a cooling module for cooling the free space optical elements without interfering with their performance. Also disclosed is a method of fabricating the free space module.

Through implementation of the system and method disclosed herein, optical elements configured to communicate with each other over free space may be held in relatively static relationships with respect to each other to thereby minimize relative movement between the optical elements. In addition, the optical elements may be held in relatively close proximity to each other to thereby substantially minimize the amount of power required to transmit and receive the modulate light signals.

In one respect, the above-identified features of the free space module are achieved through integration of the disclosed cooling module into the free space module. More particularly, the cooling module includes a cold plate having a plurality of openings that enable the free space communication between the optical elements while cooling the components of the circuit boards on which the optical elements are provided. The cooling module thus enables the circuit boards to be positioned in a relatively compact arrangement while still providing adequate cooling, without inducing additional movement that may cause the optical elements to become misaligned with respect to each other. As such, the free space module enables free space optical communications to occur between optical elements while substantially avoiding all of the drawbacks associated with conventional free space optical interconnect systems.

Figure 1:
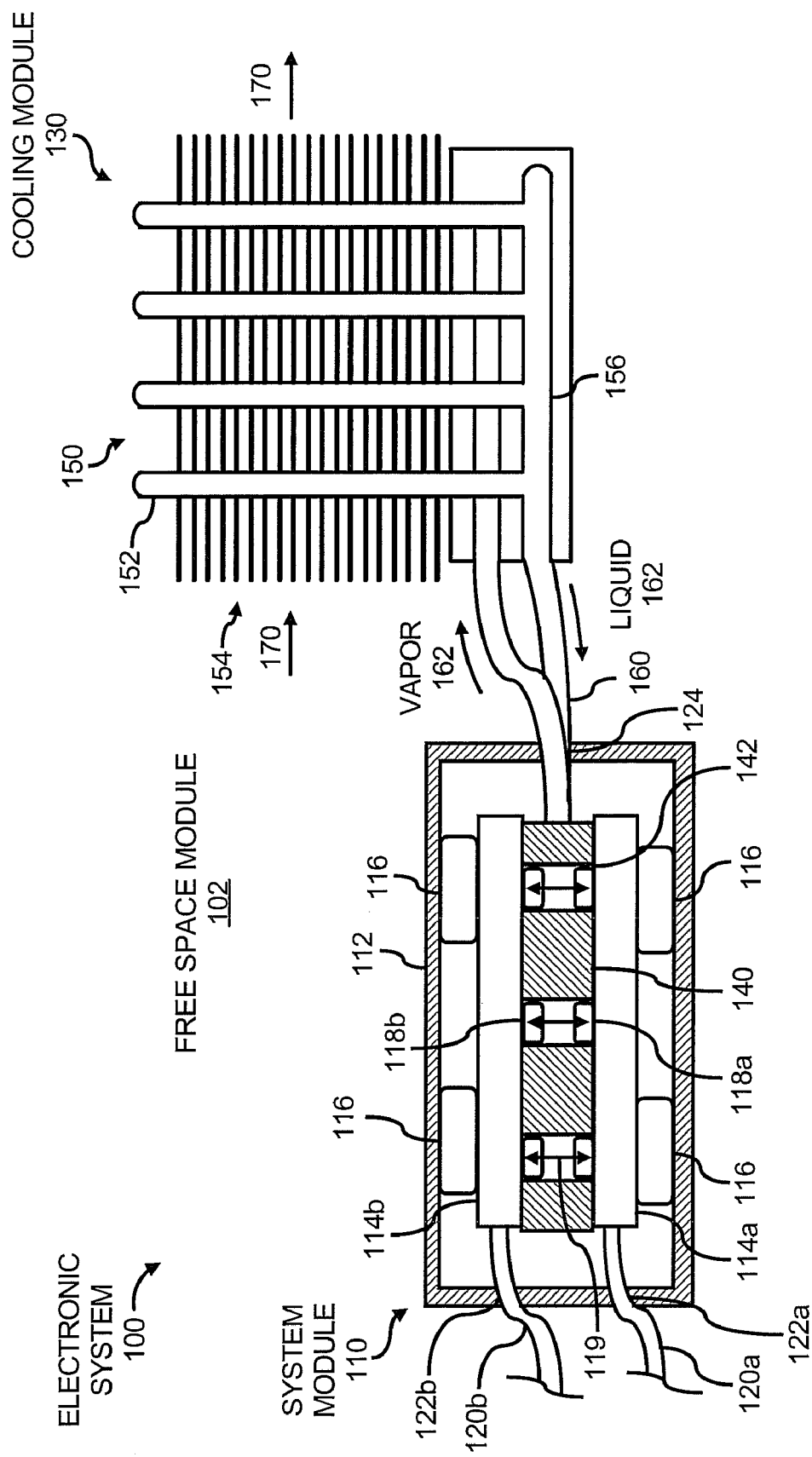
FIG. 1 shows a simplified block diagram of an electronic system, in which a free space module has been depicted in cross-section, according to an embodiment of the invention.

With reference first to FIG. 1, there is shown a simplified block diagram of an electronic system 100, in which a free space module 102 has been depicted in cross-section, according to an example. It should be understood that the following description of the electronic system 100 is but one manner of a variety of different manners in which such an electronic system 100 may be configured. In addition, it should be understood that the electronic system 100 may include additional components and that some of the components described herein may be removed and/or modified without departing from the scope of the electronic system 100. For instance, the electronic system 100 may include any reasonably suitable number of free space modules 102 arranged in any reasonably suitable configuration.

As shown in FIG. 1, the free space module 102 includes a system module 110 and a cooling module 130. The system module 110 includes a housing 112 defining a space in which circuit boards 114a and 114b are contained. The housing 112 may be formed of substantially rigid materials, such as, metals, alloys, plastics, etc., configured to withstand a relatively large amount of force. The housing 112 may therefore be configured to protect the components contained therein as well as to substantially prevent relative movement between different sections of the housing 112. The housing may comprise the four sides depicted in FIG. 1 and may also include two additional sides to thereby form a substantially encapsulated enclosure, which provides greater protection and enhances the structural rigidity of the system module 110.

The circuit boards 114a and 114b are depicted as being attached to respective interior walls of the housing 112 through connectors 116. The connectors 116 are generally configured to relatively rigidly support the respective circuit boards 114a and 114b such that they do not move laterally with respect to the housing 112. In this regard, and because the housing 112 is designed as a substantially rigid structure, the circuit boards 114a and 114b are also substantially prevented from moving laterally with respect to each other.

The connectors 116 may, however, be configured to apply sufficient force to cause the circuit boards 114a and 114b to be pushed toward each other. In this regard, the connectors 116 may comprise spring-like devices capable of exerting the force on the circuit boards 114a and 114b, such as, biasing springs.

In various examples of the system module 110, the connectors 116 may be omitted and either or both of the circuit boards 114a and 114b may be directly attached to the housing 112 through use of mechanical fasteners, adhesives, welds, etc.

In any regard, the circuit boards 114a and 114b are also depicted as including respective optical elements 118a and 118b. The optical elements 118a and 118b generally function as transmitters or receivers of modulated light over free space. As such, the optical elements 118a and 118b are configured to transmit and receive data through modulations in the light as indicated by the arrows 119. At least by virtue of the relatively rigid construction of the housing 112 and the relatively rigid connection between the circuit boards 114a and 114b and the housing 112, the optical elements 118a and 118b may maintain their alignment with respect to each other when the system module 110 is subject to various vibrations or other environmental conditions.

Although not shown, the circuit boards 114a and 114b may include other types of chips as well as various other components, such as, wires, signal layers, capacitors, transistors, etc. In addition, the circuit boards 114a and 114b are configured to receive power and signals through respective cables 120a and 120b that extend through respective holes 122a and 122b in a wall of the housing 112. According to an example, the power and signal cables 120a and 120b are flexible such that translation of external motion of the cables 120a and 120b to the circuit boards 114a and 114b is substantially prevented. In addition, or alternatively, the connectors 116 may also include cables for supplying either or both of power and signals to the circuit boards 114a and 114b.

The system module 110 also includes a cold plate 140 positioned between the first circuit board 114a and the second circuit board 114b. The cold plate 140 generally comprises a relatively rigid structure configured to have a relatively high level of thermal conductivity. In this regard, the cold plate 140 may be formed of copper, aluminum, metal alloys, silicon carbide, aluminum silicon carbide, etc. In addition, a plurality of openings 142 are formed in the cold plate 140 at least at the locations where the optical elements 118a and 118b are aligned with each other. As such, the openings 142 are placed to generally enable the optical elements 118a and 118b to transmit and receive modulated light signals over free space.

Figure 2:
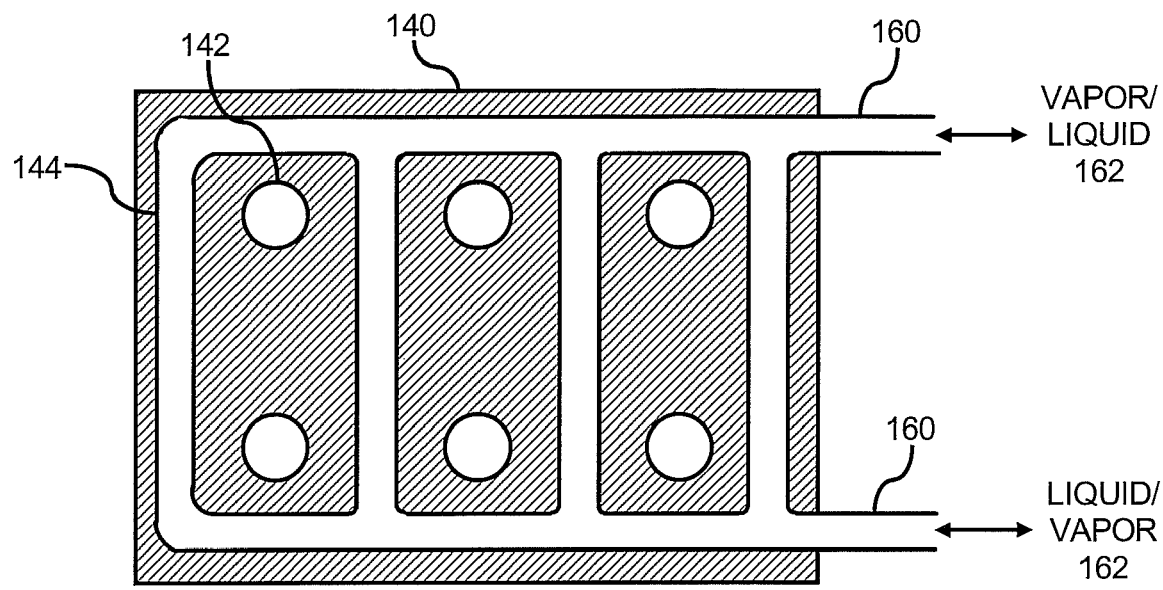
FIG. 2 shows a simplified cross-sectional top view of a cold plate depicted in FIG. 1, according to an embodiment of the invention.

The cold plate 140 also includes a plurality of channels 144 extending through the cold plate 140 around the openings 142. The channels 144 are depicted in greater detail in FIG. 2, which shows a cross-sectional top view of the cold plate 140, according to an example. As shown in FIG. 2, the channels 144 generally enable the cooling fluid 162, in the form of a liquid or a vapor, depending upon its temperature, to be substantially spread out across a relatively large area of the cold plate 140.

With reference back to FIG. 1, the cold plate 140 is depicted as being in contact with the first circuit board 114a and the second circuit board 114b. As recited throughout the present disclosure, the terms "in contact" are intended to include physical contact between the cold plate 140 and various components contained on the first circuit board 114a and the second circuit board 114b as well as physical contact between the cold plate 140 and the first and second circuit boards 114a and 114b. Thus, in one example, the cold plate 140 may be directly contact the components that generate heat on the first and second circuit boards 114a and 114b.

The optical elements 118a and 118b are depicted in FIG. 1 as also being positioned within the openings 142, such that the cold plate 140 does not interfere with the transmission and receipt of light signals between the optical elements 118a and 118b. In this regard, the openings 142 may be sufficiently wide to enable receipt of the optical elements 118a and 118b or the chips on which the optical elements 118a and 118b are attached. In addition, the openings 142 may provide additional shielding to substantially prevent airflow density from varying between the optical elements 118a and 118b.

In any regard, the connectors 116 may provide sufficient force to maintain physical contact and alignment between the first circuit board 114a, the cold plate 140, and the second circuit board 114b. In addition, or alternatively, however, sustaining the alignment between these components may be enhanced through use of adhesives, mechanical fasteners, etc. The conduction of heat between these components may also be enhanced through placement of heat conduction enhancing materials, such as, thermally conductive adhesives, films, etc., between these components. As such, thermal enhancing and/or alignment enhancing materials or structures may be used to connect the cold plate 140 to the first and second circuit boards 114a and 114b.

Although not shown, the cold plate 140 may comprise features, such as steps, grooves, indentations, etc., that complement the components contained in the first and second circuit boards 114a and 114b. Thus, for instance, the cold plate 140 may comprise an indentation at a location that corresponds to a relatively higher chip on the first circuit board 114a and a step at a location that corresponds to a relatively lower chip. In this regard, the cold plate 140 may contact greater surface areas on the first and second circuit boards 114a and 114b and thereby substantially maximize the heat absorption from the first and second circuit boards 114a and 114b.

In one regard, the cold plate 140 generally and the cooling fluid 162 contained in the channels 144 of the cold plate 140 more particularly, are configured to absorb heat generated by the heat generating components contained in the first circuit board 114a and the second circuit board 114b, to thereby maintain the components within desired temperature levels. Although not shown, the surfaces of the channels 144 may be roughened to promote heat transfer. In addition, or alternatively, the channels 144 may include one or more of grooves, mesh, sintered particles, or other types of wicking features that generally promote heat transfer and capillary pressure in the channels 144.

The cooling fluid 162 may comprise a phase change material, such as, water at reduced pressure, refrigerant, Fluourinert, etc. In this example, the cooling fluid 162 is designed to be in a liquid state at nominal temperatures and to vaporize at relatively elevated temperatures. Thus, for instance, the saturation temperature or the boiling point of the phase change material may be tailored by blending several fluids, such as, a variety of inert Fluourinert fluids. The relatively elevated temperatures may comprise those that the circuit boards 114a and 114b or the components contained thereon are predicted to reach during normal or elevated operational levels. In any regard, the channels 144 and the cold plate 140 are designed such that the vaporized cooling fluid 162 flows out of the cold plate 140 and into the fluid conduit 160. In addition, the fluid conduit 160 is designed and positioned to cause the vaporized cooling fluid 162 to flow into the condenser 150 of the cooling module 130. The condenser 150 may be elevated with respect to the cold plate 140 to thereby cause the vaporized cooling fluid 162 to flow into the condenser 150. In addition, or alternatively, a pump or compressor may be used to drive the vaporized cooling fluid 162 into the condenser 150.

Once inside the condenser 150, the vaporized cooling fluid 162 is configured to flow through one or more pipes 152 of the condenser 150. Attached to the pipes 152 are a plurality of fins 154. In operation, heat is transferred from the vaporized cooling fluid 162 to the fins 154 from which the heat is dissipated. The dissipation of heat from the fins 154 is substantially increased by the supply of airflow over the fins 154 as indicated by the arrows 170. The airflow 170 may be supplied by an air mover device (not shown) either configured and positioned to generate the airflow 170 directly to the fins 154 or configured and positioned to generally cause airflow 170 through the fins 154.

As the heat is removed from the vaporized cooling fluid 162, the vaporized cooling fluid 162 condenses back into a liquid state and collects in a reservoir 156 of the condenser 150. In addition, the liquid cooling fluid 162 is configured to flow back into the channels 144 of the cold plate 140 through the fluid conduit 160 based upon the configuration and position of the reservoir 156 with respect to the cold plate 140. That is, the liquid cooling fluid 162 may flow back into the channels 144 by the force of gravity, since the reservoir 156 is at an elevated position with respect to the cold plate 140.

According to another example, the cooling fluid 162 may comprise a non-phase changing material, such as, water at normal pressure, ethylene, glycol-water mixture, polypropelene glycol-water mix for pumped liquid cooling application, etc. The cooling fluid 162 may also include corrosion inhibitors. In this example, a pump (not shown) may be positioned along the fluid conduit 160 to apply pressure to the cooling fluid 162 and thereby cause it to flow between the cold plate 140 and the condenser 150. In addition, instead of vaporizing and condensing as with the example above, the cooling fluid 162 in this example mainly remains a liquid through both the cold plate 140 and the condenser 150. Moreover, the configuration in this example enables the condenser reservoir 156 to be at the same or lower height with respect to the cold plate 140.

In either example, the cooling fluid 162 may continuously be cycled between the cold plate 140 and the condenser 150 through the fluid conduit 160 to thereby continuously remove heat from the circuit boards 114a and 114b. As such, the fluid conduit 160 may be looped between the cold plate 140 and the condenser 150. In addition, the fluid conduit 160 may extend through one or more holes 124 in the housing 112.

According to an example, the fluid conduit 160 is made of a flexible material such that when the condenser 150 moves or vibrates, that motion or vibration is not translated to the cold plate 140. As such, an air mover may be directly attached to the condenser 150 without the vibrations from the air mover substantially causing the optical elements 118a and 118b from becoming misaligned with respect to each other.

The holes 122a, 122b, and 124 in the housing 112 through which the power and signal cables 120a and 120b and the fluid conduit 160 respectively extend may be sealed to substantially prevent the flow of air or contaminants into and out of the housing 112. As such, air contained with the housing 112 may be relatively undisturbed and thus, the transmission and receipt of light signals between the optical elements 118a and 118b may also remain relatively undisturbed. In addition, or alternatively, the space contained in the housing 112 may comprise a vacuum to further facilitate optical communications between the optical elements 118a and 118b over free space.

It should be understood that the free space module 102 depicted in FIG. 1 is a simplified illustration and may thus be modified in various respects without departing from a scope of the free space module 102 disclosed herein. For instance, the fins 154 in the condenser 150 may run vertically, a pump may be positioned along the fluid conduit 160 to return the liquid cooling fluid 162 back into the channels 144 of the cold plate 140, etc. Additional examples of variations to the system module 110 of the free space module 102 are depicted in FIGS. 3A-3C.

Figure 3A:
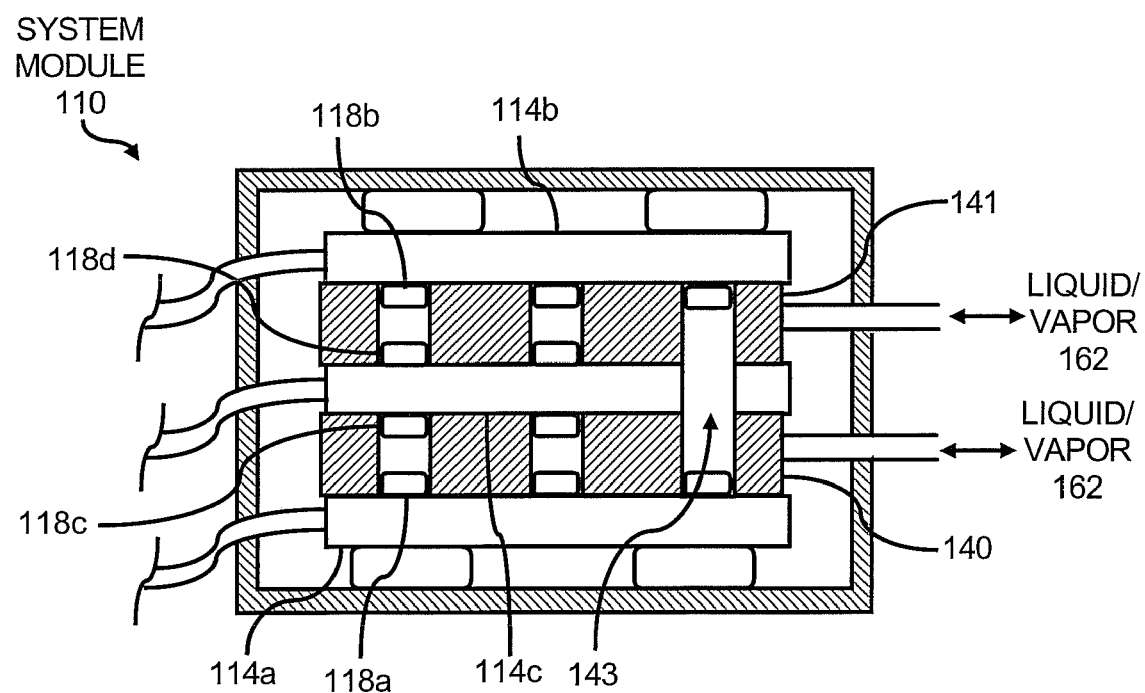
FIGS. 3A-3C, respectively, show cross-sectional side views of a system module depicted in FIG. 1, according to various embodiments of the invention.
Figure 3B:
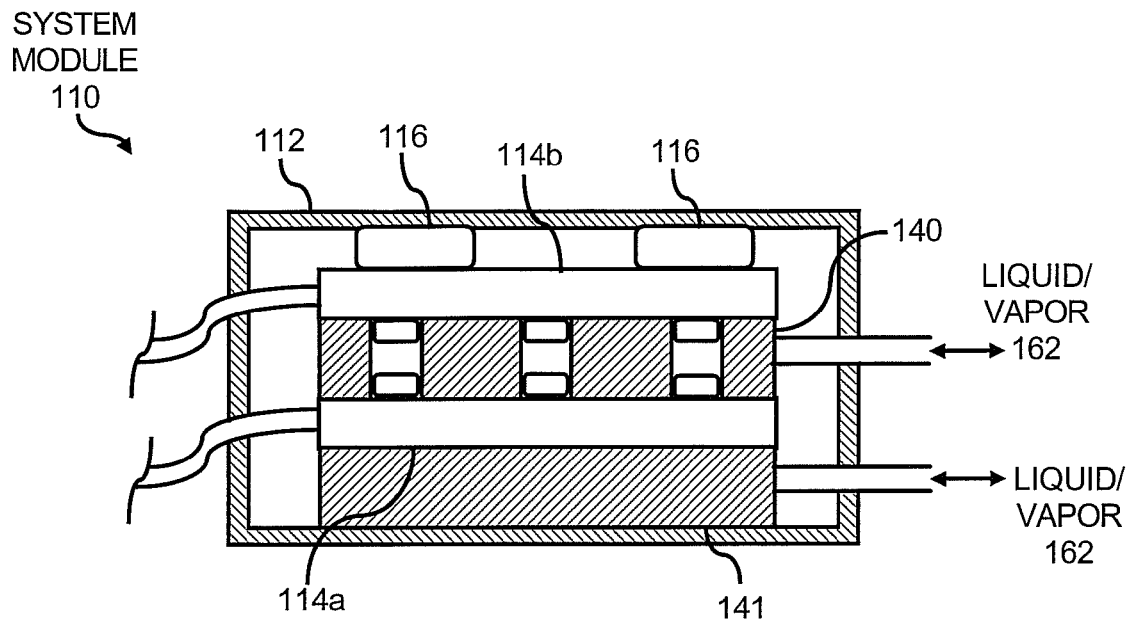
Figure 3C:
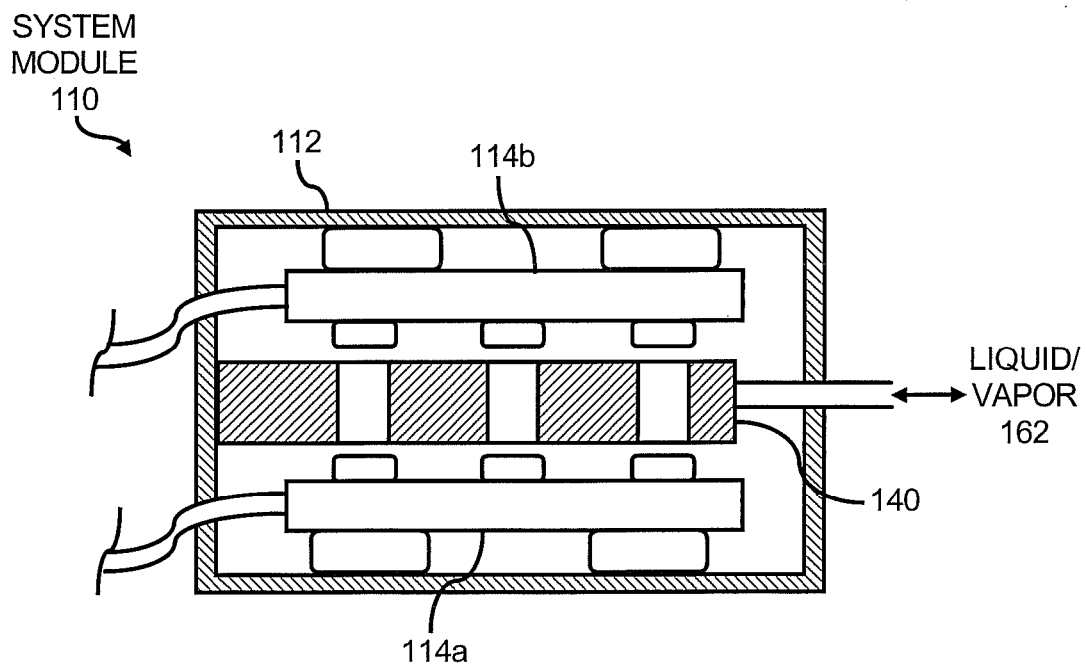

FIGS. 3A-3C, more particularly, show respective cross-sectional side views of the system module 110, according to various examples. Each of the system modules 110 depicted in FIGS. 3A-3C contains similar features to those discussed above with respect to the system module 110 depicted in FIG. 1. As such, only those features that differ in the system modules of FIGS. 3A-3C from the system module 110 of FIG. 1 will be discussed herein below.

With reference first to FIG. 3A, the system module 110 is depicted as including an additional circuit board 114c and an additional cold plate 141. As shown, a first cold plate 140 is positioned between the first circuit board 114a and the third circuit board 114c. In addition, a second cold plate 141 is positioned between the second circuit board 114b and the third circuit board 114c. The third circuit board 114c may be attached to the first and second cold plates 140 and 141 in any of the manners discussed above with respect to the first and second circuit boards 114a and 114b and the cold plate 140.

The third circuit board 114c is further depicted as including optical elements 118c and 118d located on both sides of the third circuit board 114c. In this regard, the optical element 118c is configured to transmit or receive modulated light signals from an optical element 118a of the first circuit board 114a and the optical element 118d is configured to transmit or receive modulated light signals from an optical element 118b of the second circuit board 114b. As also shown in FIG. 3A, the third circuit board 114c may include an opening 143 such that an optical element 118a of the first circuit board 114a may directly communicate with an optical element 118b of the second circuit board 114b over free space.

Additional circuit boards and cold plates may be inserted into the system module 110 in similar manners as those presented in FIG. 3A.

Turning now to FIG. 3B, the system module 110 is depicted as including the additional cold plate 141. In this figure, however, the additional cold plate 141 replaces the connectors 116 that connect the first circuit board 114a to the housing 112 depicted in FIG. 1. The additional cold plate 141 may be attached to the first circuit board 114a and to the housing 112 in various manners as described above. The additional cold plate 141 may provide additional cooling to the first circuit board 114a while still rigidly connecting the first circuit board 114a to the housing 112. The additional cold plate 141 may include the channels 144 as depicted in FIG. 2, but may be made without the openings 142.

According to another example, the connectors 116 that connect the second circuit board 114*b* may also be replaced with an additional cold plate 141. As a yet further example, the additional cold plate 141 may be attached to the housing 112 through one or more connectors 116.

With reference now to FIG. 3C, the system module 110 includes the same components as those depicted in the system module 110 of FIG. 1. However, the first circuit board 114*a*, the cold plate 140, and the second circuit board 114*b* are depicted as being separate from each other. In this example, the cold plate 140 may be directly attached to the housing 112 along one or more of its sides. In addition, the structural rigidity of the housing 112 itself is relied upon to maintain the necessary alignment between the first circuit board 114*a*, the second circuit board 114*b*, and the cold plate 140.

Although particular reference has been made to specific features in each of the system modules 110 depicted in FIGS. 1 and 3A-3C, it should be understood that various features from the system module 110 depicted in one of the figures may be incorporated into the system module 110 depicted in another one of the figures. By way of example, the connectors 116 depicted in FIG. 3A may be replaced with the additional cold plate 140 as depicted in FIG. 3B.

Figure 4:
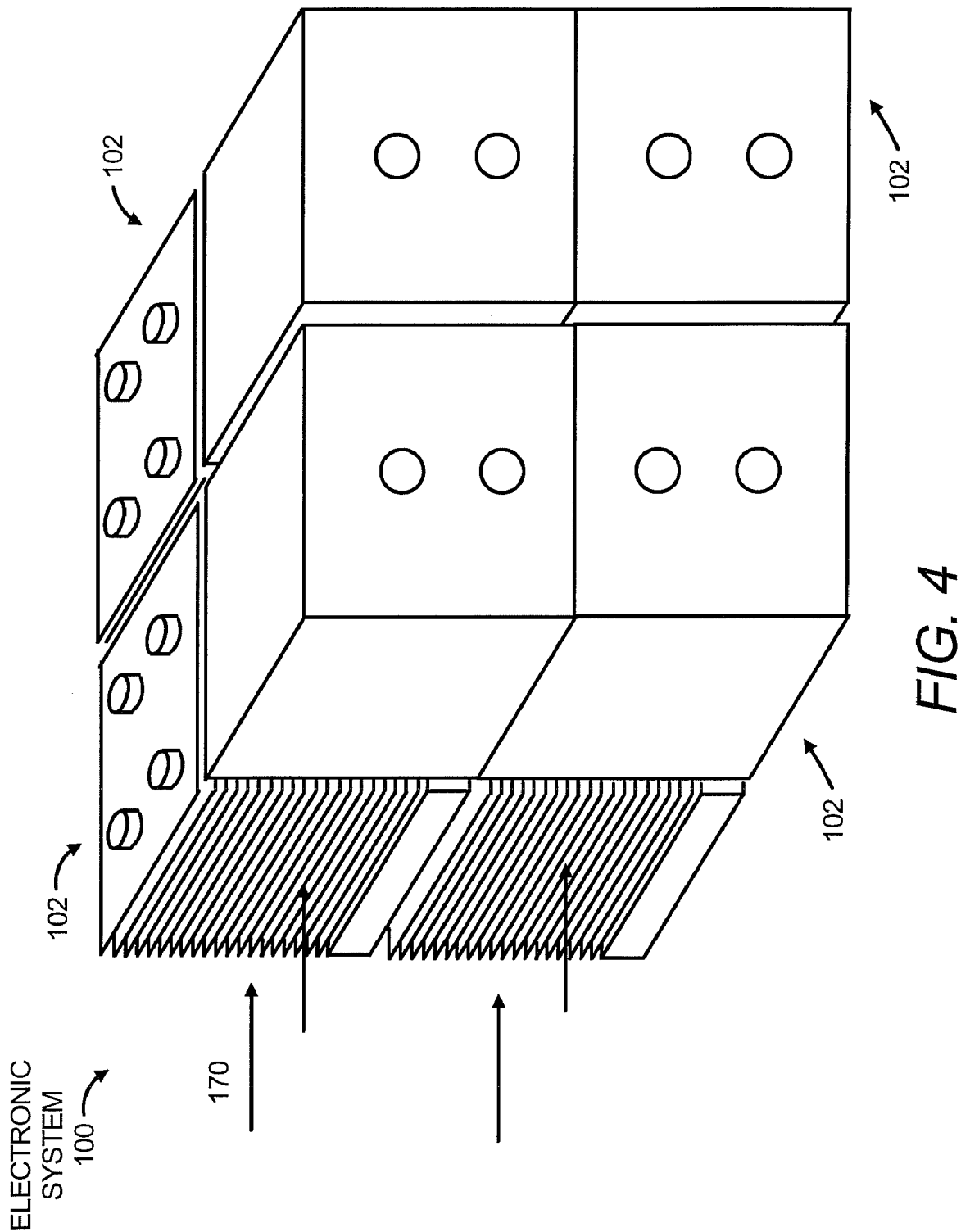
FIG. 4 shows a perspective view of an electronic system composed of multiple free space modules depicted in FIG. 1, according to an embodiment of the invention.

Turning now to FIG. 4, there is shown a perspective view of an electronic system 100 composed of multiple free space modules 102, according to an example. Although four free space modules 102 have been depicted in FIG. 4, additional free space modules 102 may be added or existing free space modules 102 may be removed without departing from a scope of the electronic system 100 depicted therein. In the event that additional free space modules 102 are added, the additional free space modules 102 may be placed adjacent to any of the free space modules 102 depicted in FIG. 4.

As shown in FIG. 4, the free space modules 102 may be arranged in a stacked configuration with respect to each other. In addition, the free space modules 102 may be arranged such that the condensers 150 of the respective cooling modules 130 are aligned with respect to the direction of airflow. In this regard, system modules 110 do not substantially obstruct the flow of air 170 through the condensers 150.

Although not shown, power and signal wires 120*a* and 120*b* may extend from the circuit boards 114*a* and 114*b* out of the free space modules 102 and may be connected to each other. In addition, or alternatively, the power and signal wires 120*a* and 120*b* may be connected to a power and network backplane similar to those known to be employed in conventional electronics cabinets.

In the example depicted in FIG. 4, the free space modules 102 may be positioned, for instance, in electronics cabinets or racks in a data center. In addition, the airflow 170 may originate from a computer room level air blower or air conditioning unit. In the latter case, the airflow 170 may be cooled and may thus enhance removal of heat from the free space modules 102.

Figure 5:
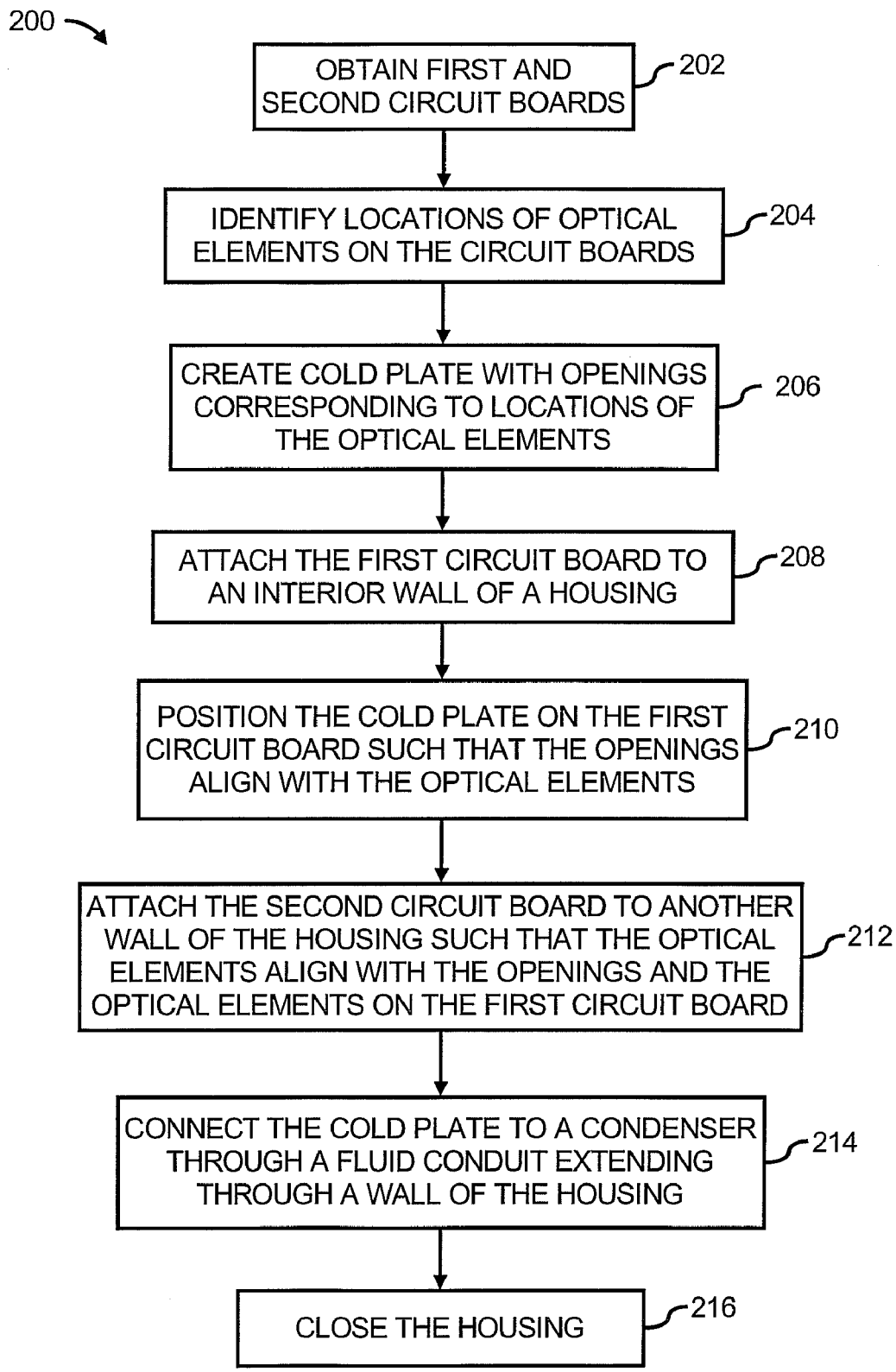
FIG. 5 shows a flow diagram of a method of fabricating free space module, according to an embodiment of the invention.

Turning now to FIG. 5, there is shown a flow diagram of a method 200 of fabricating a free space module 102, according to an embodiment. It should be understood that the following description of the method 200 is but one manner of a variety of different manners in which such a method 200 may be implemented. In addition, it should be understood that the method 200 may include additional steps and that some of the steps described herein may be removed and/or modified without departing from a scope of the method 200.

The following description of the method 200 is described with particular reference to the components depicted in FIGS. 1 and 3A-3C. It should, however, be understood that the method 200 may be performed to fabricate a free space module 102 that differs from the free space modules 102 depicted in FIGS. 1 and 3A-3C.

At step 202, a first circuit board 114*a* and a second circuit board 114*b* are obtained. The first circuit board 114*a* and the second circuit board 114*b* include optical elements 118*a* and 118*b* configured to communicate with each other over free space. At step 204, the locations of the optical elements 118*a* and 118*b* are identified. The locations of the optical elements 118*a* and 118*b* are substantially matched with one another such that when the first circuit board 114*a* and the second circuit board 114*b* are placed in an operational position, respective optical elements 118*a* and 118*b* align with one another.

At step 206, a cold plate 140 is created with a plurality of openings 142 that extend through the cold plate 140. The openings 142 are created at various locations in the cold plate 140 that correspond to the locations of the optical elements 118*a* and 118*b* identified at step 204.

At step 208, the first circuit board 114*a* is attached to an interior wall of a relatively rigid housing 112. The first circuit board 114*a* may be attached to the interior wall of the housing 112 in any of the manners discussed above. In addition, at step 210, the cold plate 140 is positioned on the first circuit board 114*a* such that the openings 142 align with the optical elements 118*a*. The cold plate 140 may be attached to the first circuit board 114 in any of the manners discussed above.

At step 212, the second circuit board 114*b* is attached to another interior wall of the housing 112 such that the optical elements 118*b* align with the openings 142 in the cold plate 140 and the optical elements 118*a* on the first circuit board 114*a*.

At step 214, the cold plate 140 may be attached to a condenser 150 through a flexible fluid conduit 160 that extends through a wall of the housing 112. In addition, the housing 112 may be closed off by attaching, for instance, a cover, lid, or additional wall over any open areas of the housing 112, as indicated at step 216.

The free space module 102 of the electronic system 100 fabricated as discussed with respect to the method 200 is configured to facilitate long-term, precise optical communications between optical elements 118*a* and 118*b* over free space. In addition, the circuit boards 114*a*, 114*b* on which the optical elements 118*a* and 118*b* are contained are cooled through use of a cooling module 130 that enables the optical elements 118*a* and 118*b* to be positioned in relatively close proximity to each other and in relatively fixed positions with respect to each other.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the scope of the invention, which is intended to be defined by the following claims—and their equivalents—in which all terms are meant in their broadest reasonable sense unless otherwise indicated.

What is claimed is:

1. An electronic system comprising:
   a first circuit board having a first optical element;
   a second circuit board having a second optical element positioned to optically communicate with the first optical element over free space;
   a cold plate positioned between the first circuit board and the second circuit board, wherein the cold plate comprises openings positioned to enable the optical communications over free space;

a condenser; and a fluid conduit containing a cooling fluid connecting the cold plate and the condenser, wherein the cooling fluid is configured to mainly absorb heat from the first and second circuit boards through the cold plate and to convey the heat to the condenser, wherein the condenser is configured to mainly dissipate the absorbed heat.

2. The electronic system according to claim 1, further comprising:

a housing formed of a relatively rigid material having a plurality of sides, wherein the first circuit board, the second circuit board, and the cold plate are housed within the enclosure, the condenser is located outside of the housing, and wherein the fluid conduit is flexibly connected to the housing and the condenser.

3. The electronic system according to claim 2, wherein the housing comprises a six-sided enclosure around the first circuit board, the second circuit board, and the cold plate.

4. The electronic system according to claim 2, further comprising:

a first connector that connects the first circuit board and a wall of the housing, wherein the first connector substantially prevents the first circuit board from moving laterally with respect to the housing; and a second connector that connects the second circuit board and another wall of the housing, wherein the second connector substantially prevents the second circuit board from moving laterally with respect to the housing.

5. The electronic system according to claim 4, wherein at least one of the first connector and the second connector comprise springs configured to apply pressure on the at least one of the first circuit board and the second circuit board to be directed toward the cold plate.

6. The electronic system according to claim 4, wherein at least one of the first connector and the second connector comprises an additional cold plate connected to the condenser through an additional fluid conduit.

7. The electronic system according to claim 2, wherein the housing comprises a system module, and the condenser comprises a cooling module, wherein the system module and the cooling module together form a free space module, and wherein the electronic system further comprises:

a plurality of free space modules, wherein each of the plurality of free space modules is positioned adjacent to at least another one of the plurality of free space modules such that the condensers of the cooling modules are substantially unobstructed by the housings of the system modules.

8. The electronic system according to claim 1, further comprising:

a third circuit board having a third optical element, said third circuit board being positioned between the second circuit board and the cold plate; and an additional cold plate positioned between the third circuit board and the second circuit board, wherein the cold plate and the additional cold plate comprises openings positioned to enable optical communications between two or more of the first optical element, the second optical element, and the third optical element.

9. The electronic system according to claim 8, wherein the third circuit board comprises at least one opening aligned with openings in the cold plate and the additional cold plate to enable the first optical element to communicate with the second optical element over free space.

10. The electronic system according to claim 1, wherein the cold plate is attached to at least one of the first circuit board and the second circuit board through use of at least one of a thermal transfer enhancing material, a thermal transfer enhancing adhesive, an adhesive, and a mechanical fastener.

11. The electronic system according to claim 1, wherein the cooling fluid comprises one of a liquid and a phase change material configured to change between a liquid and a vapor state.

12. A free space module comprising:

a system module comprising a housing, said housing containing, a first circuit board having a first optical element;

a second circuit board having a second optical element positioned to optically communicate with the first optical element over free space;

a cold plate positioned between the first circuit board and the second circuit board, wherein the cold plate further comprises openings positioned to enable the optical communications over free space;

a cooling module comprising a condenser; and a flexible fluid conduit connecting the cold plate to the condenser, wherein the fluid conduit substantially prevents movement of the cooling module to cause the system module to move.

13. The free space module according to claim 12, wherein the housing is formed of a relatively rigid material and wherein the first circuit board, the second circuit board, and the cold plate are rigidly attached to the housing to thereby substantially prevent lateral movement between the first circuit board and the second circuit board.

14. The free space module according to claim 12, wherein the system module further comprises:

a first connector that connects the first circuit board and a wall of the housing, wherein the first connector substantially prevents the first circuit board from moving laterally with respect to the housing; and a second connector that connects the second circuit board and another wall of the housing, wherein the second connector substantially prevents the second circuit board from moving laterally with respect to the housing.

15. The free space module according to claim 12, wherein the system module further comprises:

a third circuit board having a third optical element, said third circuit board being positioned between the second circuit board and the cold plate; and an additional cold plate positioned between the third circuit board and the second circuit board, wherein the cold plate and the additional cold plate comprises openings positioned to enable optical communications between two or more of the first optical element, the second optical element, and the third optical element.

16. The free space module according to claim 15, wherein the third circuit board comprises at least one opening aligned with openings in the cold plate and the additional cold plate to enable the first optical element to communicate with the second optical element over free space.

17. The free space module according to claim 12, wherein the cold plate is attached to at least one of the first circuit board and the second circuit board through use of at least one of a thermal transfer enhancing material, a thermal transfer enhancing adhesive, an adhesive, and a mechanical fastener.

18. A method of fabricating a free space module, said method comprising:

obtaining a first circuit board having a first optical element;

obtaining a second circuit board having a second optical element, wherein the first optical element and the second optical element are configured to electronically communicate with each other over free space;

identifying locations of the first optical element and the second optical element;

creating a cold plate having a plurality of openings that correspond in location to the locations of the first optical element and the second optical element;
attaching the first circuit board to a wall of a housing;
positioning the cold plate on the first circuit board such that an opening aligns with the first optical element; and
attaching the second circuit board to another wall of the housing such that the second optical element aligns with the openings in the cold plate and the first optical element.

19. The method according to claim 18, further comprising: attaching the cold plate to a condenser through a flexible fluid conduit that extends through a hole in the housing.

20. The method according to claim 18, further comprising: attaching the first circuit board and the second circuit board to the cold plate to thereby substantially prevent relative lateral movement between the first circuit board and the second circuit board.

* * * * *